(12) United States Patent
Kitamura et al.

(10) Patent No.: US 11,047,048 B2
(45) Date of Patent: *Jun. 29, 2021

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Masahito Kitamura, Toyama (JP); Hiroaki Hiramatsu, Toyama (JP); Tetsuya Takahashi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 26 days.

This patent is subject to a terminal disclaimer.

(21) Appl. No.: 16/777,623

(22) Filed: Jan. 30, 2020

(65) Prior Publication Data
US 2020/0165728 A1  May 28, 2020

Related U.S. Application Data

(63) Continuation of application No. 16/190,834, filed on Nov. 14, 2018, now Pat. No. 10,584,419.

(30) Foreign Application Priority Data

Nov. 15, 2017  (JP) .................. 2017-220187

(51) Int. Cl.
*C23C 16/52* (2006.01)
*H01L 21/02* (2006.01)
(Continued)

(52) U.S. Cl.
CPC .............. *C23C 16/52* (2013.01); *C23C 16/24* (2013.01); *C23C 16/4583* (2013.01);
(Continued)

(58) Field of Classification Search
CPC ...................................................... C23C 16/52
See application file for complete search history.

(56) References Cited

U.S. PATENT DOCUMENTS 8,624,579 B2   1/2014  Chamorovskiy et al.
8,808,455 B2   8/2014  Saito et al.
(Continued)

FOREIGN PATENT DOCUMENTS

JP   2010-118462 A   5/2010
JP   2013-225657 A   10/2013
(Continued)

OTHER PUBLICATIONS

Singaporean Search Report and Written Opinion dated May 21, 2019 for the Singaporean Patent Application No. 10201810145X.
(Continued)

*Primary Examiner* — William Coleman
(74) *Attorney, Agent, or Firm* — Volpe Koenig

(57) ABSTRACT

There is provided a technique that includes providing a substrate; and forming a film on the substrate by performing: supplying a first inert gas from a first supplier to the substrate; supplying a second inert gas from a second supplier to the substrate; and supplying a first processing gas from a third supplier, which is installed on an opposite side of the first supplier across a straight line passing through the second supplier and a center of the substrate, to the substrate, wherein in the act of forming the film, a substrate in-plane film thickness distribution of the film formed on the substrate is adjusted by controlling a balance between a flow rate of the first inert gas supplied from the first supplier and a flow rate of the second inert gas supplied from the second supplier.

20 Claims, 6 Drawing Sheets

(51) Int. Cl.
*C23C 16/458* (2006.01)
*C23C 16/24* (2006.01)
*C23C 16/455* (2006.01)

(52) U.S. Cl.
CPC .... *C23C 16/45563* (2013.01); *H01L 21/0245* (2013.01); *H01L 21/0262* (2013.01); *H01L 21/02532* (2013.01); *H01L 21/02576* (2013.01); *H01L 21/02579* (2013.01)

(56) References Cited

U.S. PATENT DOCUMENTS

| | | | |
|---|---|---|---|
| 9,732,426 | B2 | 8/2017 | Shimamoto |
| 10,388,511 | B2 | 8/2019 | Tonegawa |
| 10,584,419 | B2 * | 3/2020 | Kitamura .......... C23C 16/45561 |
| 2009/0197424 | A1 | 8/2009 | Sakai et al. |
| 2013/0065391 | A1 | 3/2013 | Ogawa et al. |
| 2013/0252435 | A1 | 9/2013 | Shimamoto et al. |
| 2014/0179085 | A1 | 6/2014 | Hirose et al. |
| 2015/0275368 | A1 | 10/2015 | Motoyama et al. |
| 2016/0071721 | A1 | 3/2016 | Shimamoto et al. |
| 2016/0284539 | A1 | 9/2016 | Horita et al. |
| 2017/0221699 | A1 | 8/2017 | Orihashi et al. |

FOREIGN PATENT DOCUMENTS

| | | |
|---|---|---|
| JP | 2016-181545 A | 10/2016 |
| KR | 20170091049 A | 8/2017 |
| TW | 200941620 A | 10/2009 |
| TW | 201612963 A | 4/2016 |
| TW | 201703143 A | 1/2017 |

OTHER PUBLICATIONS

Taiwanese Office Action dated Jun. 5, 2019 for the Taiwanese Patent Application No. 107139512.

Korean Office Action dated Sep. 19, 2019 for the Korean Patent Application No. 10-2018-0139492.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from U.S. Non-Provisional patent application Ser. No. 16/190,834, filed Nov. 14, 2018, and Japanese Patent Application No. 2017-220187, filed on Nov. 15, 2017, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, a process of forming a film on a substrate may be performed.

SUMMARY

Some embodiments of the present disclosure provide a technique capable of controlling the substrate in-plane film thickness distribution of a film formed on a substrate.

According to one embodiment of the present disclosure, there is provided a technique that includes providing a substrate; and forming a film on the substrate by performing: supplying a first inert gas from a first supplier to the substrate; supplying a second inert gas from a second supplier to the substrate; and supplying a first processing gas from a third supplier, which is installed on an opposite side of the first supplier across a straight line passing through the second supplier and a center of the substrate, to the substrate, wherein in the act of forming the film, a substrate in-plane film thickness distribution of the film formed on the substrate is adjusted by controlling a balance between a flow rate of the first inert gas supplied from the first supplier and a flow rate of the second inert gas supplied from the second supplier.

DETAILED DESCRIPTION

Figure 1:
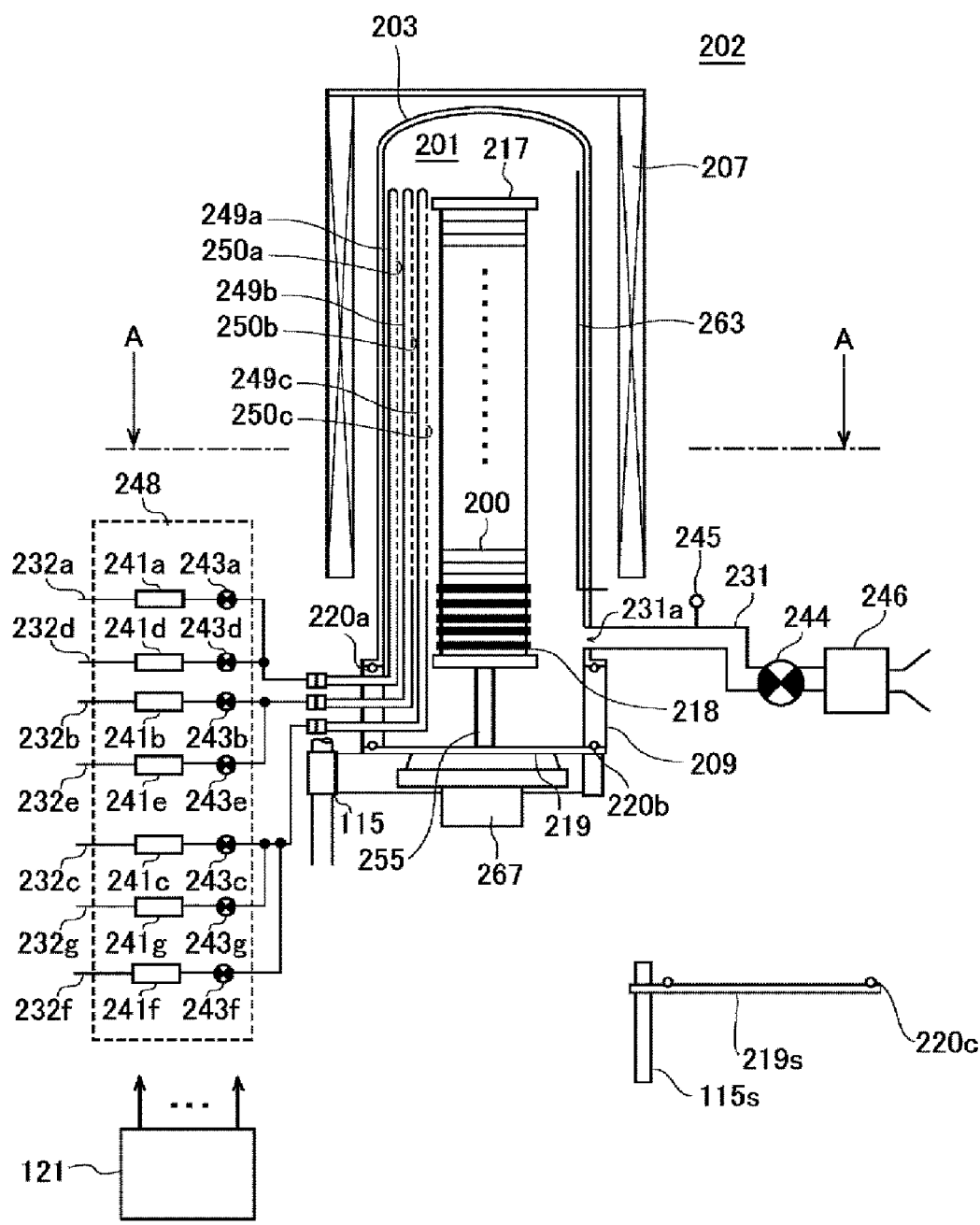
FIG. 1 is a schematic configuration diagram of a vertical process furnace of a substrate processing apparatus suitably used in an embodiment of the present disclosure, in which a part of the process furnace is shown in a vertical sectional view.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

One Embodiment of the Present Disclosure

An embodiment of the present disclosure will now be described with reference to FIGS. 1 to 4.

(1) Configuration of Substrate Processing Apparatus

As shown in FIG. 1, a process furnace 202 includes a heater 207 as a heating mechanism (temperature adjustment part). The heater 207 has a cylindrical shape and is vertically installed by being supported by a holding plate. The heater 207 also functions as an activation mechanism (excitation part) that thermally activates (excites) a gas.

Inside the heater 207, a reaction tube 203 is arranged concentrically with the heater 207. The reaction tube 203 is made of a heat-resistant material such as, for example, quartz ($SiO_2$) or silicon carbide (SiC) and is formed in a cylindrical shape with its upper end closed and its lower end opened. Under the reaction tube 203, a manifold 209 is disposed concentrically with the reaction tube 203. The manifold 209 is made of a metallic material such as, for example, stainless steel (SUS) or the like and is formed in a cylindrical shape with its upper and lower ends opened. The upper end portion of the manifold 209 is engaged with the lower end portion of the reaction tube 203 and is configured to support the reaction tube 203. An O-ring 220a as a seal member is installed between the manifold 209 and the reaction tube 203. The reaction tube 203 is vertically installed just like the heater 207. A process container (reaction container) mainly includes the reaction tube 203 and the manifold 209. A process chamber 201 is formed in the hollow portion of the process container. The process chamber 201 is configured to be able to accommodate wafers 200 as substrates. A process on the wafers 200 is performed in the process chamber 201.

In the process chamber 201, nozzles 249a to 249c as first to third suppliers are respectively installed so as to penetrate the side wall of the manifold 209. Gas supply pipes 232a to 232c are connected to the nozzles 249a to 249c, respectively. The nozzles 249a to 249c are respectively different nozzles. Each of the nozzles 249a and 249c is installed adjacent to the nozzle 249b.

Mass flow controllers (MFCs) 241a to 241c as flow rate controllers (flow rate control parts) and valves 243a to 243c as opening/closing valves are respectively installed in the gas supply pipes 232a to 232c sequentially from the upstream side of a gas flow. Gas supply pipes 232d and 232e are connected to the gas supply pipes 232a and 232b, respectively, on the downstream side of the valves 243a and 243b. Gas supply pipes 232f and 232g are respectively connected to the gas supply pipe 232c on the downstream of the valve 243c. In the gas supply pipes 232d to 232g, MFCs 241d to 241g and valves 243d to 243g are installed sequentially from the upstream side of a gas flow.

Figure 2:
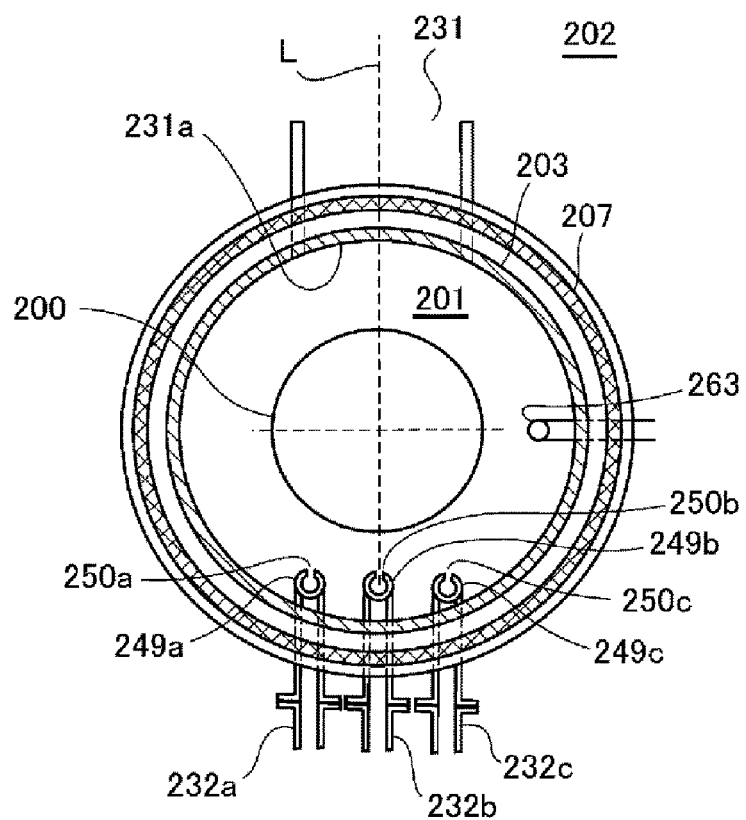
FIG. 2 is a schematic configuration diagram of a part of a vertical process furnace of a substrate processing apparatus suitably used in an embodiment of the present disclosure, in which a part of the process furnace is shown in a sectional view taken along line A-A in FIG. 1.

As shown in FIG. 2, the nozzles 249a to 249c are arranged in an annular space in a plan view between the inner wall of the reaction tube 203 and the wafers 200 and are installed so as to extend upward in the arrangement direction of the wafers 200 from the lower portion of the inner wall of the reaction tube 203 to the upper portion thereof. In other words, the nozzles 249a to 249c are respectively installed in a region existing on the side of a wafer arrangement region, in which the wafers 200 are arranged, and horizontally surrounding the wafer arrangement region, so as to extend along the wafer arrangement region. In a plan view, the nozzle 249b is disposed so as to be opposed to a below-described exhaust port 231a on a straight line across the centers of the wafers 200, which is interposed between the nozzle 249b and the exhaust port 231a, loaded into the process chamber 201. The nozzles 249a and 249c are arranged so as to sandwich a straight line L, that passes through the nozzle 249b and the center of the exhaust port 231a, from both sides along the inner wall of the reaction tube 203 (the outer peripheral portions of the wafers 200). The straight line L is also a straight line passing through the nozzle 249b and the centers of the wafers 200. That is, it can be said that the nozzle 249c is installed on the side opposite to the nozzle 249a across the straight line L. The nozzles 249a and 249c are arranged line-symmetrically with respect to the straight line L as an axis of symmetry. Gas supply holes 250a to 250c for supplying gases are formed on the side surfaces of the nozzles 249a to 249c, respectively. Each of the gas supply holes 250a to 250c is opened so as to oppose (face) the exhaust port 231a in a plan view and is capable of supplying a gas toward the wafers 200. The gas supply holes 250a to 250c are formed in a plural number from the lower portion to the upper portion of the reaction tube 203.

From the gas supply pipe 232a, a processing gas (second processing gas), for example, a silane-based gas containing silicon (Si) as a main element constituting a seed layer to be described later is supplied into the process chamber 201 via the MFC 241a, the valve 243a, and the nozzle 249a. As the silane-based gas, it may be possible to use a halogen-element-free silicon hydride gas, for example, a disilane ($Si_2H_6$, abbreviation: DS) gas.

From the gas supply pipe 232b, a processing gas (third processing gas), for example, a gas containing Si and a halogen element, i.e., a halosilane-based gas is supplied into the process chamber 201 via the MFC 241b, the valve 243b and the nozzle 249b. The halogen element includes chlorine (Cl), fluorine (F), bromine (Br), iodine (I), and the like. As the halosilane-based gas, it may be possible to use a chlorosilane-based gas containing Si and Cl, for example, a dichlorosilane ($SiH_2Cl_2$, abbreviation: DCS) gas.

From the gas supply pipe 232c, a processing gas (first processing gas), for example, a silane-based gas containing Si as a main element constituting a film formed on each of the wafers 200 is supplied into the process chamber 201 via the MFC 241c, the valve 243c and the nozzle 249c. As the silane-based gas, it may be possible to use a halogen-element-free silicon hydride gas, for example, a monosilane ($SiH_4$, abbreviation: MS) gas.

From the gas supply pipes 232d to 232f, an inert gas, for example, a nitrogen ($N_2$) gas is supplied into the process chamber 201 via the MFCs 241d to 241f, the valves 243d to 243f, the gas supply pipes 232a to 232c and the nozzles 249a to 249c. The $N_2$ gas functions as a purge gas, a carrier gas, a dilution gas and the like, and further functions as a film thickness distribution control gas for controlling the in-plane film thickness distribution of the film formed on each of the wafers 200.

From the gas supply pipe 232g, a dopant gas, for example, a gas containing an impurity (dopant) is supplied into the process chamber 201 via the MFC 241g, the valve 243g, the gas supply pipe 232c and the nozzle 249c. As the dopant gas, it is possible to use a gas containing an element which is one of a group III element (group 13 element) and a group V element (group 15 element) and which becomes solid by itself, for example, a phosphine ($PH_3$, abbreviation: PH) gas which is a gas containing a group V element.

A processing gas supply system mainly includes the gas supply pipes 232a to 232c, the MFCs 241a to 241c and the valves 243a to 243c. The gas supply pipe 232g, the MFC 241g and the valve 243g may be included in the processing gas supply system. Further, an inert gas supply system mainly includes the gas supply pipes 232d to 232f, the MFCs 241d to 241f and the valves 243d to 243f. In this specification, the gas supply system including the gas supply pipe 232d, the MFC 241d and the valve 243d is also referred to as a first supply system. The gas supply pipe 232a, the MFC 241a and the valve 243a may be included in the first supply system. The gas supply system including the gas supply pipe 232e, the MFC 241e and the valve 243e is also referred to as a second supply system. The gas supply pipe 232b, the MFC 241b and the valve 243b may be included in the second supply system. The gas supply system including the gas supply pipe 232c, the MFC 241c and the valve 243c is also referred to as a third supply system. The gas supply pipes 232g and 232f, the MFCs 241g and 241f, and the valves 243g and 243f may be included in the third supply system.

One or all of the above-mentioned various supply systems may be configured as an integrated supply system 248 formed by integrating the valves 243a to 243g, the MFCs 241a to 241g and the like. The integrated supply system 248 is connected to each of the gas supply pipes 232a to 232g and is configured so that the supply operations of the various gases to the gas supply pipes 232a to 232g, i.e., the opening/closing operation of the valves 243a to 243g, the flow rate adjustment operation of the MFCs 241a to 241g, and the like can be controlled by a controller 121 which will be described later. The integrated supply system 248 may be formed of one-piece-type or split-type integrated units. The integrated supply system 248 may be attached to and detached from the gas supply pipes 232a to 232g or the like on an integrated unit basis. The maintenance, replacement, expansion or the like of the integrated supply system 248 may be performed on an integrated unit basis.

An exhaust port 231a for exhausting the atmosphere inside the process chamber 201 is installed in the lower portion of the side wall of the reaction tube 203. As shown in FIG. 2, the exhaust port 231a is installed at a position opposed to (facing) the nozzles 249a to 249c (gas supply holes 250a to 250c) across the wafers 200 in a plan view. The exhaust port 231a may be installed to extend from the lower portion to the upper portion of the side wall of the reaction tube 203, i.e., along the wafer arrangement region. An exhaust pipe 231 is connected to the exhaust port 231a. A vacuum pump 246 as a vacuum-exhaust device is connected to the exhaust pipe 231 via a pressure sensor 245 as a pressure detector (pressure detection part) for detecting the pressure inside the process chamber 201 and an APC (Auto Pressure Controller) valve 244 as a pressure regulator (pressure regulation part). The APC valve 244 is configured so that the vacuum-exhaust of the interior of the process chamber 201 and the stop of the vacuum-exhaust can be performed by opening and closing the APC valve 244 in a state in which the vacuum pump 246 is operated, and so that the pressure inside the process chamber 201 can be adjusted by adjusting the valve opening degree based on the pressure information detected by the pressure sensor 245 in a state in which the vacuum pump 246 is operated. An exhaust system mainly includes the exhaust pipe 231, the APC valve 244 and the pressure sensor 245. The vacuum pump 246 may be included in the exhaust system.

A seal cap 219 as a furnace opening lid capable of airtightly closing the lower end opening of the manifold 209 is installed below the manifold 209. The seal cap 219 is made of a metallic material such as, for example, stainless steel or the like and is formed in a disc shape. On the upper surface of the seal cap 219, there is installed an O-ring 220b as a seal member which makes contact with the lower end of the manifold 209. Under the seal cap 219, there is installed a rotation mechanism 267 for rotating a boat 217 to be described later. A rotating shaft 255 of the rotation mechanism 267 passes through the seal cap 219 and is connected to the boat 217. The rotation mechanism 267 is configured to rotate the wafers 200 by rotating the boat 217. The seal cap 219 is configured to be raised and lowered in the vertical direction by a boat elevator 115 as an elevating mechanism installed outside the reaction tube 203. The boat elevator 115 is configured as a transfer device (transfer mechanism) that loads and unloads (transfers) the wafers 200 into and out of the process chamber 201 by raising and lowering the seal cap 219. Under the manifold 209, there is installed a shutter 219s as a furnace opening lid capable of airtightly closing the lower end opening of the manifold 209 in a state in which the seal cap 219 is lowered to unload the boat 217 from the process chamber 201. The shutter 219s is made of a metallic material such as, for example, stainless steel or the like and is formed in a disk shape. On the upper surface of the shutter 219s, there is installed an O-ring 220c as a seal member which makes contact with the lower end of the manifold 209. The opening/closing operations (the elevating operation, the rotating operation and the like) of the shutter 219s are controlled by a shutter opening/closing mechanism 115s.

The boat 217 serving as a substrate support is configured to support a plurality of wafers 200, e.g., 25 to 200 wafers 200 in such a state that the wafers 200 are arranged in a horizontal posture and in multiple stages along a vertical direction with the centers of the wafers 200 aligned with one another. The boat 217 is made of a heat-resistant material such as, for example, quartz or SiC. Heat insulating plates 218 made of a heat-resistant material such as, for example, quartz or SiC are disposed at multiple stages in the lower portion of the boat 217.

In the reaction tube 203, there is installed a temperature sensor 263 as a temperature detector. By adjusting the state of supplying electric power to the heater 207 based on the temperature information detected by the temperature sensor 263, the temperature inside the process chamber 201 is controlled to have a desired temperature distribution. The temperature sensor 263 is installed along the inner wall of the reaction tube 203.

Figure 3:
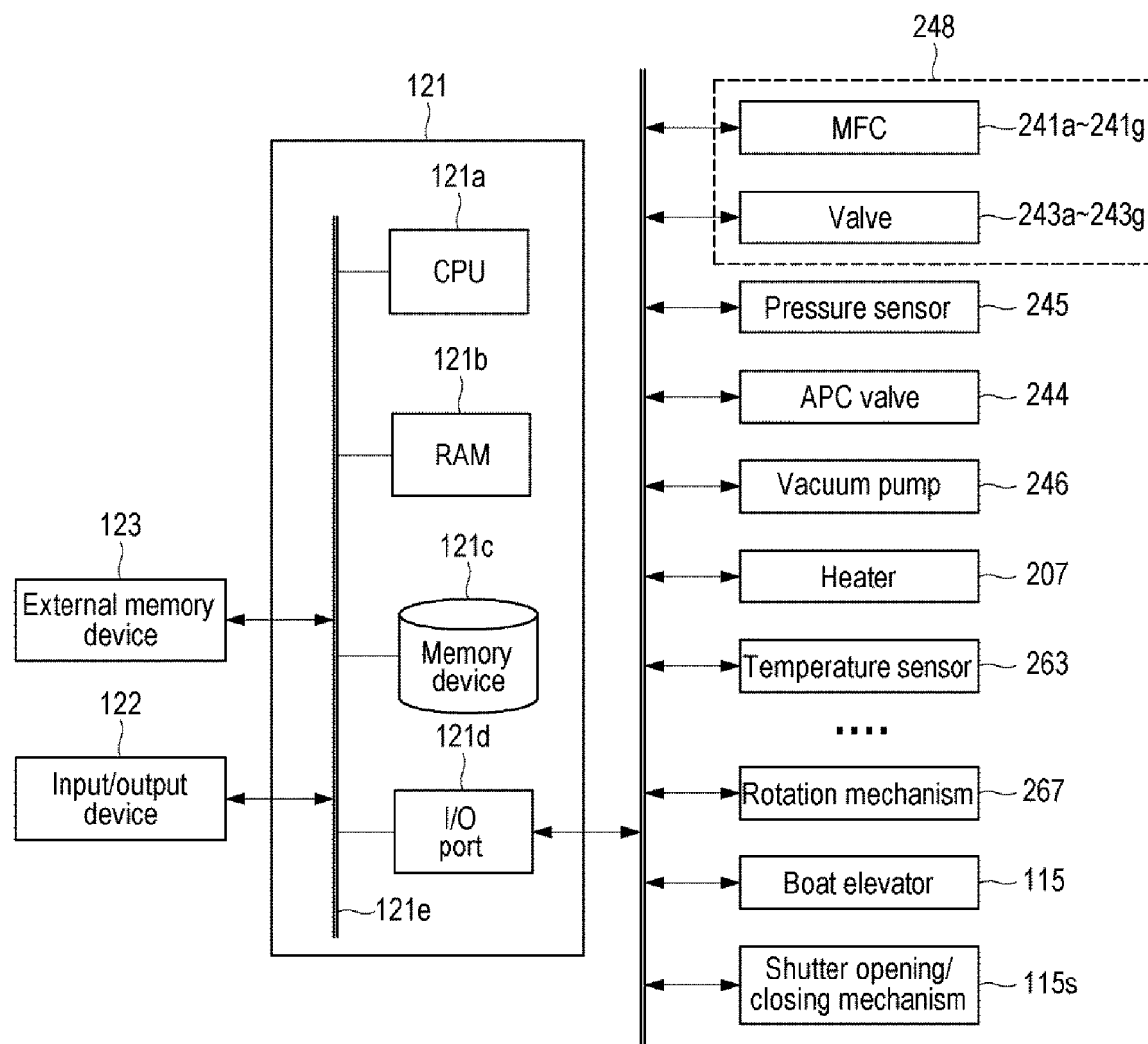
FIG. 3 is a schematic configuration diagram of a controller of a substrate processing apparatus suitably used in an embodiment of the present disclosure, in which a control system of the controller is shown in a block diagram.

As shown in FIG. 3, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 formed of, for example, a touch panel or the like is connected to the controller 121.

The memory device 121c is configured by, for example, a flash memory, a hard disc drive (HDD), or the like. A control program for controlling the operations of the substrate processing apparatus, a process recipe in which sequences and conditions of a substrate processing process to be described later are written, and the like are readably stored in the memory device 121c. The process recipe functions as a program for causing the controller 121 to execute each sequence in the substrate processing process, which will be described later, to obtain a predetermined result. Hereinafter, the process recipe and the control program will be generally and simply referred to as a program. Further, the process recipe will be simply referred to as a recipe. When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFCs 241a to 241g, the valves 243a to 243g, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read the control program from the memory device 121c and execute the same. The CPU 121a is also configured to read the process recipe from the memory device 121c according to an input of an operation command from the input/output device 122 or the like. The CPU 121a is configured to control, according to the contents of the process recipe thus read, the flow rate adjustment operation of various gases by the MFCs 241a to 241g, the opening/closing operation of the valves 243a to 243g, the opening/closing operation of the APC valve 244, the pressure regulation operation performed by the APC valve 244 based on the pressure sensor 245, the driving and stopping of the vacuum pump 246, the temperature adjustment operation performed by the heater 207 based on the temperature sensor 263, the operation of rotating the boat 217 with the rotation mechanism 267 and adjusting the rotation speed of the boat 217, the operation of raising and lowering the boat 217 with the boat elevator 115, the opening/closing operation of the shutter 219s by the shutter opening/closing mechanism 115s, and the like.

The controller 121 may be configured by installing, in a computer, the above-described program stored in an external memory device 123. The external memory device 123 includes, for example, a magnetic disk such as an HDD or the like, an optical disk such as a CD or the like, a magneto-optical disk such as an MO or the like, a semiconductor memory such as a USB memory or the like, and so forth. The memory device 121c or the external memory device 123 is configured as a non-transitory computer-readable recording medium. Hereinafter, the memory device 121c and the external memory device 123 will be generally and simply referred to as a recording medium. When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate Processing Process

An example of a substrate processing sequence for forming a film on a substrate, i.e., an example of a film formation sequence will be described with reference to FIG. 4 as one of the processes of manufacturing a semiconductor device using the substrate processing apparatus described above. In the following description, the operations of the respective parts constituting the substrate processing apparatus are controlled by the controller 121.

Figure 4:
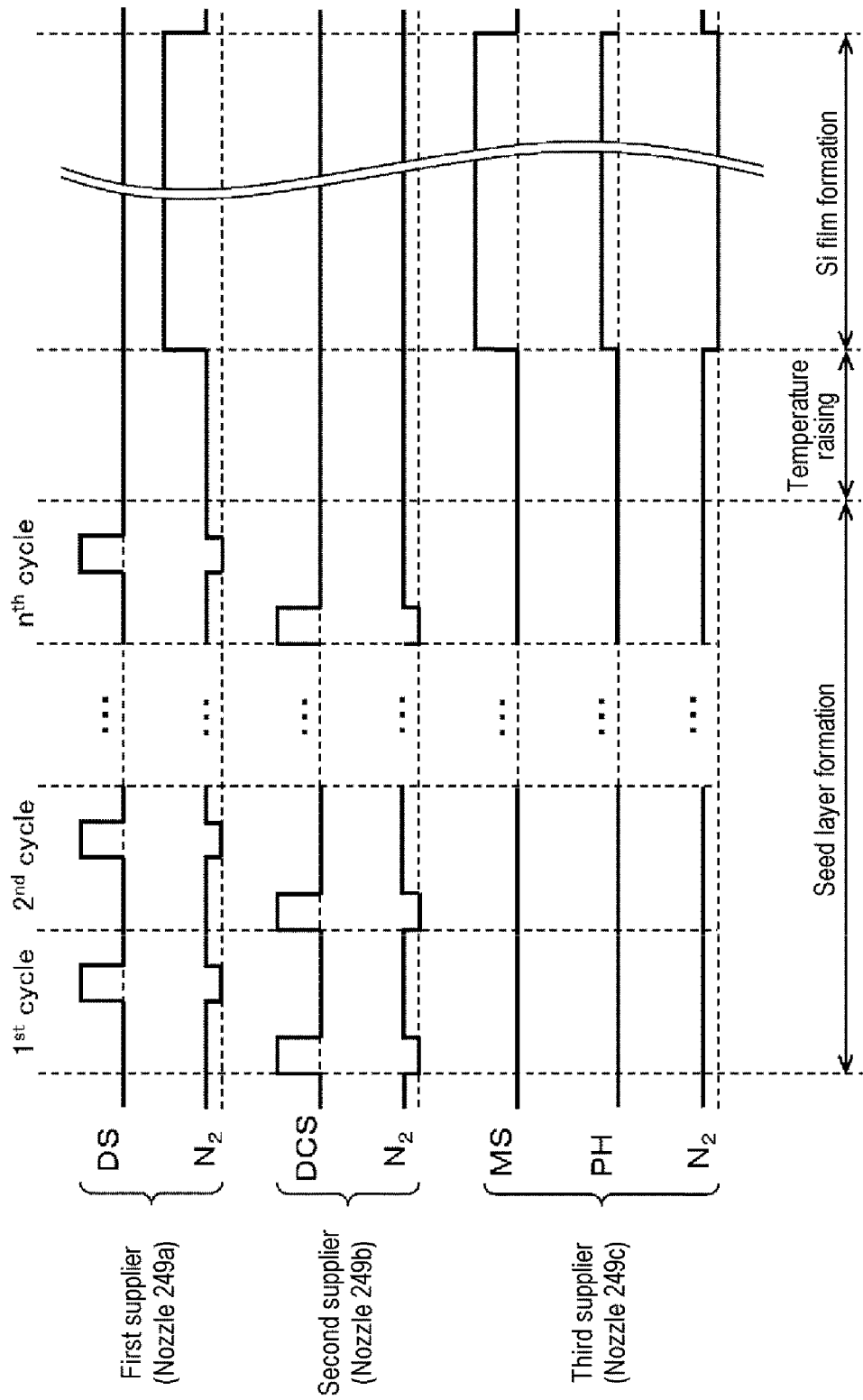
FIG. 4 is a diagram showing a film-forming sequence according to an embodiment of the present disclosure.

In the film formation sequence shown in FIG. 4, there is performed a step (Si film formation step) of forming a Si-containing film added (doped) with P, i.e., a P-doped Si film, on a wafer 200, by preparing the wafer 200 as a substrate, then supplying an $N_2$ gas as an inert gas to the wafer 200 from a nozzle 249a as a first supplier, supplying an $N_2$ gas as an inert gas to the wafer 200 from a nozzle 249b as a second supplier, and supplying an MS gas as a first processing gas and a PH gas as a dopant gas to the wafer 200 from a nozzle 249c as a third supplier installed on the opposite side of the nozzle 249a across a straight line L passing through the nozzle 249b and the center of the wafer 200 in a plan view. In this specification, the P-doped Si film is also simply referred to as a Si film.

In the film formation sequence shown in FIG. 4, after preparing the wafer 200 and before performing the Si film formation step described above, there is performed a step (seed layer formation step) of forming a layer containing Si, i.e., a Si layer as a seed layer on the wafer 200, by supplying a DS gas as a second processing gas to the wafer 200 from the nozzle 249a, supplying an $N_2$ gas to the wafer 200 from the nozzle 249b and supplying an $N_2$ gas to the wafer 200 from the nozzle 249c. Hereinafter, this Si layer is also referred to as a Si seed layer.

Specifically, in the seed layer formation step, a cycle of alternately performing step 1 of supplying a DCS gas as a third processing gas to the wafer 200 from any one of the nozzles 249a to 249c (in this case, the nozzle 249b) and step 2 of supplying a DS gas to the wafer 200 from the nozzle 249a, supplying an $N_2$ gas to the wafer 200 from the nozzle 249b and supplying an $N_2$ gas to the wafer 200 from the nozzle 249c is performed a predetermined number of times.

In the above-described Si film formation step, the wafer in-plane film thickness distribution of the Si film formed on the wafer 200 (hereinafter also simply referred to as an in-plane film thickness distribution) is adjusted by controlling the balance between the flow rate of the $N_2$ gas supplied from the nozzle 249a and the flow rate of the $N_2$ gas supplied from the nozzle 249b.

As an example, description will now be made on an example where a bare wafer having a small surface area with no concavo-convex structure formed on the surface thereof is used as the wafer 200 and the in-plane film thickness distribution of the Si film is adjusted by the film formation sequence and the flow rate control described above. In this specification, the in-plane film thickness distribution of a film which is thickest at the central portion of the wafer 200 and gradually becomes thinner toward the outer peripheral portion (peripheral edge portion) is also referred to as a center convex distribution. Further, the in-plane film thickness distribution of a film which is thinnest at the central portion of the wafer 200 and becomes gradually thicker towards the outer peripheral portion is also referred to as a center concave distribution. Moreover, the film thickness distribution of a flat film with little film thickness variation from the central portion to the outer peripheral portion of the wafer 200 is also referred to as a flat distribution. If a film having a center convex distribution can be formed on a bare wafer, it is possible to form a film having a flat distribution on a pattern wafer (product wafer) having a large surface area with a fine concavo-convex structure formed on the surface thereof.

In this specification, the film formation sequence shown in FIG. 4 may be denoted as follows for the sake of convenience. The same notation is also used in the following description of modifications and the like.

$$(DCS \rightarrow DS) \times n \rightarrow MS + PH \Rightarrow \text{P-doped Si}$$

When the term "wafer" is used herein, it may refer to "a wafer itself" or "a laminated body of a wafer and a predetermined layer or film formed on the surface of the wafer." Furthermore, when the phrase "a surface of a wafer" is used herein, it may refer to "a surface of a wafer itself" or "a surface of a predetermined layer or the like formed on a wafer." Moreover, the expression "a predetermined layer is formed on a wafer" as used herein may mean that "a predetermined layer is directly formed on a surface of a wafer itself" or that "a predetermined layer is formed on a layer or the like formed on a wafer." In addition, when the term "substrate" is used herein, it may be synonymous with the term "wafer."

(Wafer Charging and Boat Loading)

When a plurality of wafers 200 is charged on the boat 217 (wafer charging), the shutter 219s is moved by the shutter opening/closing mechanism 115s to open the lower end opening of the manifold 209 (shutter open). Thereafter, as shown in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

(Pressure Regulation and Temperature Adjustment)

The interior of the process chamber 201, namely the space in which the wafers 200 exist, is vacuum-exhausted (depressurization-exhausted) by the vacuum pump 246 so as to reach a desired pressure (degree of vacuum). At this time, the pressure in the process chamber 201 is measured by the pressure sensor 245. The APC valve 244 is feedback-controlled based on the measured pressure information. The wafers 200 in the process chamber 201 are heated by the heater 207 to a desired film-forming temperature. At this time, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaustion of the process chamber 201 and the heating and rotation of the wafers 200 may be continuously performed at least until the processing of the wafers 200 is completed.

(Seed Layer Formation Step)

Thereafter, the following steps 1 and 2 are sequentially executed.

[Step 1]

In this step, a DCS gas is supplied from the nozzle 249b to the wafer 200 in the process chamber 201, and an $N_2$ gas is supplied from each of the nozzles 249a and 249c to the wafer 200.

Specifically, the valve 243b is opened and the DCS gas is allowed to flow into the gas supply pipe 232b. The flow rate of the DCS gas is adjusted by the MFC 241b. The DCS gas is supplied into the process chamber 201 via the nozzle 249b and is exhausted from the exhaust port 231a. At this time, the DCS gas is supplied to the wafer 200. Furthermore, at this time, the valves 243d and 243f are opened and the $N_2$ gas is supplied into the process chamber 201 via each of the nozzles 249a and 249c.

By supplying the DCS gas to the wafer 200 under the processing conditions to be described later, it is possible to remove a natural oxide film, impurities, etc. from the surface of the wafer 200 by the treatment action (etching action) possessed by the DCS gas. This makes it possible to clean the surface of the wafer 200. Thus, the surface of the wafer 200 can become a surface on which the adsorption of Si, i.e., the formation of a seed layer easily proceeds in step 2 to be described later.

After the surface of the wafer 200 is cleaned, the valve 243b is closed and the supply of the DCS gas into the process chamber 201 is stopped. Then, the inside of the process chamber 201 is vacuum-exhausted and the gas or the like remaining in the process chamber 201 is removed from the inside of the process chamber 201. At this time, the valves 243d to 243f are opened and the $N_2$ gas is supplied into the process chamber 201 via the nozzles 249a to 249c. The $N_2$ gas supplied from the nozzles 249a to 249c acts as a purge gas, whereby the interior of the process chamber 201 is purged (purging step).

[Step 2]

After step 1 is finished, a DS gas is supplied from the nozzle 249a to the surface of the wafer 200 existing in the process chamber 201, i.e., the surface of the cleaned wafer 200, and an $N_2$ gas is supplied from each of the nozzles 249b and 249c.

Specifically, the valve 243a is opened and the DS gas is allowed to flow into the gas supply pipe 232a. The flow rate of the DS gas is adjusted by the MFC 241a. The DS gas is supplied into the process chamber 201 via the nozzle 249a and is exhausted from the exhaust port 231a. At this time, the DS gas is supplied to the wafer 200. Furthermore, at this time, the valves 243e and 243f are opened and the $N_2$ gas is supplied into the process chamber 201 via each of the nozzles 249b and 249c.

By supplying the DS gas to the wafer 200 under the processing conditions to be described later, it is possible to allow Si contained in the DS gas to be adsorbed on the surface of the wafer 200 cleaned in step 1 and to form seeds (nuclei) on the surface of the wafer 200. Under the processing conditions to be described later, the crystal structure of the nuclei formed on the surface of the wafer 200 is amorphous.

After the nucleus is formed on the surface of the wafer 200, the valve 243a is closed and the supply of the DS gas into the process chamber 201 is stopped. Then, the gas or the like remaining in the process chamber 201 is removed from the inside of the process chamber 201 by the same processing procedure as in the purging step of step 1.

[Performed a Predetermined Number of Times]

By performing a cycle, which performs the above-described steps 1 and 2 alternately, i.e., non-synchronously without synchronizing steps 1 and 2, a predetermined number of times (n times where n is an integer of 1 or more), it is possible to form a seed layer having the aforementioned nuclei arranged at a high density, i.e., an Si seed layer on the wafer 200.

An example of processing conditions used in step 1 is described as follows.

DCS gas supply flow rate: 10 to 1000 sccm
DCS gas supply time: 0.5 to 10 minutes
$N_2$ gas supply flow rate (per gas supply pipe): 10 to 10000 sccm
Processing temperature (first temperature): 350 to 450 degrees C.
Processing pressure: 400 to 1000 Pa An example of processing conditions used in step 2 is described as follows.

DS gas supply flow rate: 10 to 1000 sccm
DS gas supply time: 0.5 to 10 minutes
Other processing conditions are the same as the processing conditions used in step 1.

In step 1, as the third processing gas, in addition to the DCS gas, it may be possible to use a chlorosilane-based gas such as a monochlorosilane ($SiH_3Cl$, abbreviation: MCS) gas, a tetrachlorosilane ($SiCl_4$, abbreviation: STC) gas, a trichlorosilane ($SiHCl_3$, abbreviation: TCS) gas, a hexachlorodisilane ($Si_2Cl_6$, abbreviation: HCDS) gas, an octachlorotrisilane ($Si_3Cl_8$, abbreviation: OCTS) gas or the like. Furthermore, as the third processing gas, it may be possible to use a tetrafluorosilane ($SiF_4$) gas, a tetrabromosilane ($SiBr_4$) gas, a tetraiodosilane ($SiI_4$) gas or the like. That is, as the third processing gas, in addition to the chlorosilane-based gas, it may be possible to use a halosilane-based gas such as a fluorosilane-based gas, a bromosilane-based gas, an iodosilane-based gas or the like. In addition, as the third processing gas, it may be possible to use an Si-free halogen-based gas such as a hydrogen chloride (HCl) gas, a chlorine ($Cl_2$) gas, a trichloroborane ($BCl_3$) gas, a chlorine fluoride ($ClF_3$) gas or the like.

In step 2, as the second processing gas, in addition to the DS gas, it may be possible to use a silicon hydride gas such as an MS gas, a trisilane ($Si_3H_8$) gas, a tetrasilane ($Si_4H_{10}$) gas, a pentasilane ($Si_5H_{12}$) gas, a hexasilane ($Si_6H_{14}$) gas or the like.

As the inert gas, in addition to the $N_2$ gas, it may be possible to use a rare gas such as an Ar gas, a He gas, a Ne gas, a Xe gas or the like. This also applies to a temperature raising step, a Si film formation step and the like which will be described later.

(Temperature Raising Step)

After the seed layer formation step is finished, the output of the heater 207 is adjusted so that the temperature inside the process chamber 201 is changed to a second temperature higher than the aforementioned first temperature. When this step is performed, the valves 243d to 243f are opened and the $N_2$ gas is supplied into the process chamber 201 via the nozzles 249a to 249c to purge the inside of the process chamber 201. After the temperature inside the process chamber 201 reaches the second temperature and becomes stable, the Si film formation step to be described later is started.

(Si Film Formation Step)

In this step, an MS gas and a PH gas are supplied from the nozzle 249c to the wafer 200 in the process chamber 201, i.e., the surface of the seed layer formed on the wafer 200, and an $N_2$ gas is supplied from each of the nozzles 249a and 249b.

Specifically, the valve 243c is opened and the MS gas is allowed to flow into the gas supply pipe 232c. The flow rate of the MS gas is adjusted by the MFC 241c. The MS gas is supplied into the process chamber 201 via the nozzle 249c and is exhausted from the exhaust port 231a. At this time, the valve 243g is opened and the PH gas is allowed to flow into the gas supply pipe 232g. The flow rate of the PH gas is adjusted by the MFC 241g. The PH gas is supplied into the process chamber 201 via the gas supply pipe 232c and the nozzle 249c and is exhausted from the exhaust port 231a. At this time, the MS gas and the PH gas are supplied simultaneously to the wafer 200. Furthermore, at this time, the valves 243d and 243e are opened and the $N_2$ gas is supplied into the process chamber 201 via each of the nozzles 249a and 249b.

By supplying the MS gas and the PH gas to the wafer 200 from the nozzle 249c under the processing conditions described later, it is possible to cause Si to be adsorbed (deposited) on the surface of the wafer 200, i.e., on the seed layer formed on the wafer 200, thereby forming a P-doped Si film. Under the processing conditions described later, the crystal structure of the Si film formed on the wafer 200 becomes amorphous, polycrystalline or an amorphous/polycrystalline mixed structure.

When supplying the MS gas or the PH gas (hereinafter also referred to as MS gas or the like) to the wafer 200, the balance between the flow rate of the $N_2$ gas supplied from the nozzle 249a and the flow rate of the $N_2$ gas supplied from the nozzle 249b is controlled. Specifically, for example, the flow rate of the $N_2$ gas supplied from the nozzle 249a is made different from the flow rate of the $N_2$ gas supplied from the nozzle 249b. This makes it possible to adjust the in-plane film thickness distribution of the Si film formed on the wafer 200.

In the film formation sequence shown in FIG. 4, as an example, there is shown a case where the flow rate of the $N_2$ gas supplied from the nozzle 249a is made larger than the flow rate of the $N_2$ gas supplied from the nozzle 249b. In this case, for example, the flow rate of the $N_2$ gas supplied from the nozzle 249a is set to 500 to 2000 sccm and the flow rate of the $N_2$ gas supplied from the nozzle 249b is set to 10 to 400 sccm. By controlling the flow rate balance in this way, it is possible to control the wafer in-plane concentration distribution (partial pressure distribution) of the MS gas or the like supplied to the wafer 200, i.e., the supply amount distribution of the MS gas or the like in the wafer plane. More specifically, the concentration (supply amount) of the MS gas or the like supplied to the central portion of the wafer 200 may be controlled in an increasing direction, and the concentration (supply amount) of the MS gas or the like supplied to the outer peripheral portion of the wafer 200 is controlled in a decreasing direction. Depending on the degree of the control, the concentration (supply amount) of the MS gas or the like supplied to the central portion of the wafer 200 may be set to the same level as the concentration (supply amount) of the MS gas or the like supplied to the outer peripheral portion of the wafer 200, or may be set to be larger than the concentration (supply amount) of the MS gas or the like supplied to the outer peripheral portion of the wafer 200. As a result, it becomes possible to bring the in-plane film thickness distribution of the Si film formed on the wafer 200 closer to a flat distribution or to a center convex distribution from a center concave distribution.

After the Si film having a desired in-plane film thickness distribution is formed on the wafer 200, the valves 243c and 243g are closed and the supply of the MS gas and the PH gas into the process chamber 201 is stopped. Then, the gas and the like remaining in the process chamber 201 are removed from the inside of the process chamber 201 by the same processing procedure as that of the purging step of the above-described step 1.

An example of processing conditions used in the Si film formation step is described as follows.
MS gas supply flow rate: 10 to 2000 sccm
PH gas supply flow rate: 0.1 to 500 sccm
MS gas and PH gas supply time: 1 to 300 minutes
$N_2$ gas supply flow rate (per gas supply pipe): 10 to 20000 sccm
Processing temperature (second temperature): 500 to 650 degrees C.
Processing pressure: 30 to 200 Pa The processing conditions shown here are the conditions under which the MS gas is thermally decomposed in the process chamber 201 when the MS gas exists alone, i.e., the conditions under which a CVD reaction occurs. That is, the processing conditions shown here are the conditions under which no self-limit is imposed on adsorption (deposition) of Si on the wafer 200, i.e., the conditions under which the adsorption of Si on the wafer 200 is not self-limited.

As the first processing gas, in addition to the MS gas, it may be possible to use the various kinds of silicon hydride gases described above and the various kinds of the halosilane-based gases described above. In order to suppress the remaining of a halogen element in the Si film, it is preferable to use a silicon hydride gas as the first processing gas. In order to improve the deposition rate of the Si film, it is preferable to use a highly-reactive halosilane-based gas as the first processing gas.

As the dopant gas, in addition to the PH gas, it may be possible to use a gas such as an arsine ($AsH_3$) gas or the like containing an element (P, arsenic (As) or the like) which is a Group V element and which becomes solid by itself. Furthermore, as the dopant gas, in addition to the gas containing a Group V element, it may be possible to use a gas such as a diborane ($B_2H_6$) gas, a trichloroborane ($BCl_3$) gas or the like containing an element (boron (B) or the like) which is a Group III element and which becomes solid by itself.

(After-Purging and Atmospheric Pressure Restoration)

After the Si film formation step is completed, the $N_2$ gas as a purge gas is supplied from the nozzles 249a to 249c into the process chamber 201 and is exhausted from the exhaust port 231a. As a result, the interior of the process chamber 201 is purged and the gas or the reaction byproduct remaining in the process chamber 201 is removed from the process chamber 201 (after-purging). Thereafter, the atmosphere in the process chamber 201 is replaced with an inert gas (inert gas replacement), and the pressure in the process chamber 201 is restored to the atmospheric pressure (atmospheric pressure restoration).

(Boat Unloading and Wafer Discharging)

The seal cap 219 is lowered by the boat elevator 115 and the lower end opening of the manifold 209 is opened. Then, the processed wafers 200 are unloaded from the lower end of the manifold 209 to the outside of the reaction tube 203 in a state in which they are supported by the boat 217 (boat unloading). After the boat unloading, the shutter 219s is moved so that the lower end opening of the manifold 209 is sealed by the shutter 219s via the O-ring 220c (shutter closing). The processed wafers 200 are taken out from the boat 217 after they are unloaded to the outside of the reaction tube 203 (wafer discharging).

(3) Effects of the Present Embodiment

According to the present embodiment, one or more of the following effects may be obtained.

(a) When supplying the MS gas from the nozzle 249c in the Si film formation step, by controlling the balance between the flow rate of the $N_2$ gas supplied from the nozzle 249a and the flow rate of the $N_2$ gas supplied from the nozzle 249b, it is possible to adjust the in-plane film thickness distribution of the Si film formed on the wafer 200. For example, it is possible to set the in-plane film thickness distribution of the Si film formed on the wafer 200 configured as a bare wafer to become a center convex distribution. Thus, when a pattern wafer is used as the wafer 200, it is possible to form a Si film having a flat distribution on the wafer 200.

Although the in-plane film thickness distribution of the film formed on the wafer 200 depends on the surface area of the wafer 200, it is considered that this is due to the so-called loading effect. When a precursor such as an MS gas or the like flows from the outer peripheral portion to the central portion of the wafer 200 as in the substrate processing apparatus according to the present embodiment, as the surface area of the wafer 200 subjected to film formation becomes larger, the precursor such as the MS gas or the like is consumed in a large amount at the outer peripheral portion of the wafer 200, and thus it becomes hard for the precursor to reach the central portion of the wafer 200. As a result, the in-plane film thickness distribution of the film formed on the wafer 200 tends to become a center concave distribution. According to the present embodiment, even when a pattern wafer having a large surface area is used as the wafer 200, it is possible to correct the in-plane film thickness distribution of the film formed on the wafer 200 from a center concave distribution to a flat distribution, ultimately to a center convex distribution. This makes it possible to freely control the in-plane film thickness distribution of the film formed on the wafer 200.

(b) In the Si film formation step, by supplying the $N_2$ gas using the two nozzles 249a and 249b, as compared with a case where the $N_2$ gas is supplied using one nozzle, it is possible to precisely and widely adjust the in-plane film thickness distribution of the Si film to be formed on the wafer 200. This is because, according to the method of the present embodiment, it is possible to individually, i.e., independently, control the concentration (supply amount) of the MS gas or the like supplied to the central portion of the wafer 200 and the concentration (supply amount) of the MS gas or the like supplied to the outer peripheral portion of the wafer 200.

(c) By disposing at least the nozzle 249b, preferably the nozzles 249a to 249c so as to be opposed to the exhaust port 231a at least in a plan view, it is possible to enhance the controllability of the in-plane film thickness distribution of the Si film formed on the wafer 200. Further, by arranging the nozzles 249a and 249c line-symmetrically with respect to the straight line L as a symmetry axis, it becomes possible to further enhance the controllability of the in-plane film thickness distribution of the Si film formed on the wafer 200.

(d) By performing the seed layer formation step after preparing the wafer 200 and before performing the Si film formation step, it is possible to shorten the incubation time (growth delay) of the Si film formed on the wafer 200, thereby improving the productivity of the film-forming process.

(e) In the seed layer formation step, by alternately performing the supply of the DCS gas and the supply of the DS gas, it is possible to enhance the formation efficiency of the seed layer and to make the seed layer dense. This makes it possible to enhance the productivity of the film-forming process and to make the Si film formed on the wafer 200 dense. In addition, by alternately supplying the gases, it is possible to suppress excess gas phase reaction in the process chamber 201 and to improve the quality of the film-forming process.

(f) The aforementioned effects may be similarly obtained even when using the first processing gas other than the MS gas, using the second processing gas other than the DS gas, using the third processing gas other than the DCS gas, using the dopant gas other than PH gas, and using the inert gas other than the $N_2$ gas.

(4) Modification

The film formation step according to the present embodiment is not limited to the embodiment shown in FIG. 4, but may be changed as in the following modifications. These modifications may be arbitrarily combined. Unless specifically mentioned otherwise, the processing procedures and processing conditions in each step of each of the modifications may be the same as the processing procedures and processing conditions in each step of the above-described substrate processing sequence.

(Modification 1)

In the film formation sequence shown in FIG. 4, there has been described an example where the seed layer formation step is performed. However, the seed layer formation step may not be performed. Even in this modification, when the MS gas is supplied from the nozzle 249c in the Si film formation step, by controlling the balance between the flow rate of the $N_2$ gas supplied from the nozzle 249a and the flow rate of the $N_2$ gas supplied from the nozzle 249b, it becomes possible to adjust the in-plane film thickness distribution of the Si film formed on the wafer 200.

(Modification 2)

In the Si film formation step, when the MS gas or the like is supplied from the nozzle 249c, the flow rate of the $N_2$ gas supplied from the nozzle 249a may be smaller than the flow rate of the $N_2$ gas supplied from the nozzle 249b. In this case, for example, the flow rate of the $N_2$ gas supplied from the nozzle 249a is set to 10 to 400 sccm and the flow rate of the $N_2$ gas supplied from the nozzle 249b is set to 500 to 2000 sccm. By controlling the flow rate balance in this manner, it is possible to control the concentration (supply amount) of the MS gas or the like supplied to the central portion of the wafer 200 in a decreasing direction and to control the concentration (supply amount) of the gas or the like supplied to the outer peripheral portion of the wafer 200 in an increasing direction. As a result, it becomes possible to bring the in-plane film thickness distribution of the Si film formed on the wafer 200 closer to a flat distribution, ultimately to a center concave distribution from a center convex distribution.

In the case where the in-plane film thickness distribution of the Si film formed on the wafer 200 becomes a desired distribution, when the MS gas or the like is supplied from the nozzle 249c, the flow rate of the $N_2$ gas supplied from the nozzle 249a and the flow rate the $N_2$ gas supplied from the nozzle 249b may be made equal to each other without making them different.

(Modification 3)

In step 2 of the seed layer formation step as well as the Si film formation step, when the DS gas is supplied from the nozzle 249a, it may be possible to control the balance between the flow rate of the $N_2$ gas supplied from the nozzle 249b and the flow rate of the $N_2$ gas supplied from the nozzle 249c. For example, the in-plane thickness distribution of the seed layer formed on the wafer 200 may be adjusted by making the flow rate of the $N_2$ gas supplied from the nozzle 249b different from the flow rate of the $N_2$ gas supplied from the nozzle 249c. As a result, it becomes possible to adjust the in-plane film thickness distribution of the Si film formed on the wafer 200.

For example, when the DS gas is supplied from the nozzle 249a, the flow rate of the $N_2$ gas supplied from the nozzle 249b may be smaller than the flow rate of the $N_2$ gas supplied from the nozzle 249c. In this case, for example, the flow rate of the $N_2$ gas supplied from the nozzle 249b is set to 10 to 400 sccm and the flow rate of the $N_2$ gas supplied from the nozzle 249c is set to 500 to 2000 sccm. By controlling the flow rate balance in this manner, it is possible to bring the in-plane thickness distribution of the seed layer formed on the wafer 200 closer to a flat distribution, ultimately to a center convex distribution from a center concave distribution.

Moreover, for example, when the DS gas is supplied from the nozzle 249a, the flow rate of the $N_2$ gas supplied from the nozzle 249b may be larger than the flow rate of the $N_2$ gas supplied from the nozzle 249c. In this case, for example, the flow rate of the $N_2$ gas supplied from the nozzle 249b is set to 500 to 2000 sccm and the flow rate of the $N_2$ gas supplied from the nozzle 249c is set to 10 to 400 sccm. By controlling the flow rate balance in this manner, it is possible to bring the in-plane thickness distribution of the seed layer formed on the wafer 200 closer to a flat distribution, ultimately to a center concave distribution from a center convex distribution.

(Modification 4)

In step 2 of the seed layer formation step, the $N_2$ gas may be supplied from the nozzle 249a to the wafer 200, the $N_2$ gas may be supplied from the nozzle 249b to the wafer 200, and the DS gas may be supplied from the nozzle 249c to the wafer 200. That is, in the Si film formation step and step 2 of the seed layer formation step, the processing gases (the DS gas and the MS gas) may be supplied from the common nozzle 249c.

In this case, in step 2, when the DS gas is supplied from the nozzle 249c, by controlling the balance between the flow rate of the $N_2$ gas supplied from the nozzle 249a and the flow rate of the $N_2$ gas supplied from the nozzle 249b, it is possible to adjust the in-plane thickness distribution of the seed layer formed on the wafer 200. In this case, the supply conditions of the $N_2$ gas supplied from each of the nozzles 249a and 249b can be the same as those in the Si film formation step.

For example, when the DS gas is supplied from the nozzle 249c, by making the flow rate of the $N_2$ gas supplied from the nozzle 249a larger than the flow rate of the $N_2$ gas supplied from the nozzle 249b, it becomes possible to bring the in-plane thickness distribution of the seed layer formed on the wafer 200 closer to a flat distribution, ultimately to a center convex distribution from a center concave distribution. As a result, it is possible to adjust the in-plane film thickness distribution of the Si film formed on the wafer 200.

Furthermore, for example, when the DS gas is supplied from the nozzle 249c, by making the flow rate of the $N_2$ gas supplied from the nozzle 249a smaller than the flow rate of the $N_2$ gas supplied from the nozzle 249b, it becomes possible to bring the in-plane thickness distribution of the seed layer formed on the wafer 200 closer to a flat distribution, ultimately to a center concave distribution from a center convex distribution. As a result, it is possible to adjust the in-plane film thickness distribution of the Si film formed on the wafer 200.

(Modification 5)

In step 1 of the seed layer formation step, the DCS gas may be supplied to the wafer 200 from any of the nozzles 249a and 249c.

In step 1, when supplying the DCS gas from the nozzle 249c, it may be possible to control the balance between the flow rate of the $N_2$ gas supplied from the nozzle 249a and the flow rate of the $N_2$ gas supplied from the nozzle 249b. For example, by making the flow rate of the $N_2$ gas supplied from the nozzle 249a different from the flow rate of the $N_2$ gas supplied from the nozzle 249b, it is possible to make the degree of cleaning performed on the surface of the wafer 200 different in the plane of the wafer 200. Thus, it is possible to adjust the in-plane thickness distribution of the seed layer formed on the wafer 200. As a result, it is possible to adjust the in-plane film thickness distribution of the Si film formed on the wafer 200.

For example, when supplying the DCS gas from the nozzle 249c, by making the flow rate of the $N_2$ gas supplied from the nozzle 249a larger than the flow rate of the $N_2$ gas supplied from the nozzle 249b, the cleaning action at the central portion of the wafer 200 may be controlled in an increasing direction and the cleaning action at the outer peripheral portion of the wafer 200 may be controlled in a decreasing direction. This makes it possible to bring the in-plane thickness distribution of the seed layer formed on the wafer 200, i.e., the in-plane film thickness distribution of the Si film formed on the wafer 200 closer to a flat distribution, ultimately to a center convex distribution from a center concave distribution.

Furthermore, for example, when supplying the DCS gas from the nozzle 249c, by making the flow rate of the $N_2$ gas supplied from the nozzle 249a smaller than the flow rate of the $N_2$ gas supplied from the nozzle 249b, the cleaning action at the central portion of the wafer 200 may be controlled in a decreasing direction and the cleaning action at the outer peripheral portion of the wafer 200 may be controlled in an increasing direction. This makes it possible to bring the in-plane thickness distribution of the seed layer formed on the wafer 200, i.e., the in-plane film thickness distribution of the Si film formed on the wafer 200 closer to a flat distribution, ultimately to a center concave distribution from a center convex distribution.

When supplying the DCS gas from the nozzle 249a in step 1, by controlling the balance between the flow rate of the $N_2$ gas supplied from the nozzle 249b and the flow rate of the $N_2$ gas supplied from the nozzle 249c, it is possible to obtain the same effects.

(Modification 6)

In modifications 3 to 5, the flow rate balance control for the $N_2$ gas in the Si film formation step may not be performed. Even in this case, it is possible to adjust the in-plane film thickness distribution of the Si film formed on the wafer 200 to some extent by adjusting the in-plane thickness distribution of the seed layer formed on the wafer 200.

(Modification 7)

As in the film formation sequence shown below, in the seed layer formation step, step 1 may not be performed and step 2 may be performed a predetermined number of times (one or more times). Furthermore, in step 2, as the second processing gas, in addition to the silicon hydride gas, it may be possible to use an aminosilane-based gas such as a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdiethylaminosilane ($Si[N(C_2H_5)_2]_2H_2$, abbreviation: BDEAS) gas, a bis-tertiary-butylaminosilane ($SiH_2[NH(C_4H_9)]_2$, abbreviation:

BTBAS) gas, a diisopropylaminosilane (SiH₃N[CH(CH₃)₂]₂, abbreviation: DIPAS) gas or the like.

DIPAS→MS+PH⇒P-doped Si (Modification 8)

As in the film formation sequence shown below, in the seed layer formation step, each of steps 1 and 2 may be performed once. In addition, in step 1, in addition to the halosilane-based gas, an Si-free halogen-based gas such as an HCl gas or the like may be used as the third processing gas.

HCl→DS→MS+PH⇒P-doped Si (Modification 9)

As the first processing gas, in addition to the silicon hydride gas, it may be possible to use, for example, a chlorosilane-based gas such as a DCS gas, an HCDS gas or the like, or an aminosilane-based gas such as a 3DMAS gas, a BDEAS gas or the like.

In addition to the above-described processing gases, as a reactant, it may be possible to additionally use, for example, an amine-based gas such as a triethylamine ((C₂H₅)₃N, abbreviation: TEA) gas or the like, an oxygen (O)-containing gas (oxidizing agent) such as an oxygen (O₂) gas, a water vapor (H₂O gas), an ozone (O₃) gas, a plasma-excited O₂ gas (O₂*), a mixture of an O₂ gas and a hydrogen (H₂) gas or the like, a carbon (C)-containing gas such as a propylene (C₃H₆) gas or the like, and a B-containing gas such as a BCl₃ gas or the like.

For example, according to the film formation sequences shown below, a silicon nitride film (Si film), a silicon oxynitride film (SiON film), a silicon oxycarbide film (SiOC film), a silicon carbonitride film (SiCN film), a silicon oxycarbonitride film (SiOCN film), a silicon borocarbonitride film (SiBCN film), a silicon boronitride film (SiBN film), and a silicon oxide film (SiO film) may be formed on the wafer 200. In the following film formation sequences, when supplying the first processing gas (the DCS gas, the HCDS gas, the 3DMAS gas or the BDEAS gas) from the nozzle 249c, the balance of the flow rates of the N₂ gases supplied from the nozzles 249a and 249b is controlled in the same manner as in the film formation sequence shown in FIG. 4 or the modification described above. Thus, the same effects as those of the film formation sequence shown in FIG. 4 or the above-described modifications are obtained.

DCS+NH₃⇒SiN (DCS→NH₃)×n⇒SiN (HCDS→NH₃→O₂)×n⇒SiON (HCDS→TEA→O₂)×n⇒SiOC(N)

(HCDS→C₃H₆→NH₃)×n⇒SiCN (HCDS→C₃H₆→NH₃→O₂)×n⇒SiOCN (HCDS→C₃H₆→BCl₃→NH₃)×n⇒SiBCN (HCDS→BCl₃→NH₃)×n⇒SiBN (HCDS→O₂+H₂)×n⇒SiO (3DMAS→O₃)×n⇒SiO (BDEAS→O₂*)×n⇒SiO

An example of processing conditions in the step of supplying the first processing gas in this modification is described as follows.

First processing gas supply flow rate: 10 to 2000 sccm
First processing gas supply time: 1 to 120 seconds
Processing temperature: 250-800 degrees C.
Processing pressure: 1 to 2666 Pa
Other processing conditions are the same as the processing conditions in the Si film formation step of the film formation sequence shown in FIG. 4.

An example of processing conditions in the step of supplying the reactant is described as follows.

Reactant supply flow rate: 100 to 10000 sccm
Reactant supply time: 1 to 120 seconds
Processing pressure: 1 to 4000 Pa
Other processing conditions are the same as the processing conditions in the step of supplying the first processing gas in this modification.

Even in this modification, the seed layer formation step may be performed on the wafer 200 after preparing the wafer 200 and before performing the film formation sequence described above.

Other Embodiments

The embodiment of the present disclosure has been concretely described above. However, the present disclosure is not limited to the above-described embodiment. Various modifications may be made without departing from the spirit of the present disclosure.

In the above-described embodiment, there has been described an example where the nozzles 249a to 249c are installed adjacent to each other (in close proximity with each other). However, the present disclosure is not limited to such embodiments. For example, the nozzles 249a and 249c may be installed at the positions away from the nozzle 249b in the annular space in a plan view between the inner wall of the reaction tube 203 and the wafers 200.

In the above-described embodiment, there has been described an example where the first to third suppliers are composed of the nozzles 249a to 249c and the three nozzles are installed in the process chamber 201. However, the present disclosure is not limited to such embodiments. For example, at least one selected from the group of the first to third suppliers may be composed of two or more nozzles. Further, a nozzle other than the first to third suppliers may be newly installed in the process chamber 201, and an N₂ gas or various processing gases may be further supplied using this nozzle. When the nozzle other than the nozzles 249a to 249c is installed in the process chamber 201, the newly installed nozzle may be installed at a position facing the exhaust port 231a in a plan view or may be installed at a position not facing the exhaust port 231a. That is, the newly installed nozzle may be located at a position spaced apart from the nozzles 249a to 249c, for example, an intermediate position between the nozzles 249a to 249c and the exhaust port 231a or a position near the intermediate position along the outer peripheries of the wafers 200 in the annular space in a plan view between the inner wall of the reaction tube 203 and the wafers 200.

In the above-described embodiment, there has been described an example where the film containing Si as a main element is formed on the substrate. However, the present disclosure is not limited to such embodiments. That is, the present disclosure may be suitably applied to a case where a film not containing Si but containing a semimetal element such as germanium (Ge), B or the like as a main element is formed on the substrate. The present disclosure may also be suitably applied to a case where a film containing a metal element such as titanium (Ti), zirconium (Zr), hafnium (Hf), niobium (Nb), tantalum (Ta), molybdenum (Mo), tungsten (W), yttrium (Y), lanthan (La), strontium (Sr), aluminum (Al) or the like as a main element is formed on the substrate.

It is preferable that the recipes used for substrate processing are individually prepared according to the processing contents and stored in the memory device 121c via the electric communication line or the external memory device 123. When starting a process, it is preferable that the CPU 121a appropriately selects an appropriate recipe from the plurality of recipes stored in the memory device 121c according to the substrate processing contents. This makes it possible to form films of various film types, composition ratios, film qualities and film thicknesses with high reproducibility in one substrate processing apparatus. It is also possible to reduce the burden on an operator and to quickly start the process while avoiding operation errors.

The above-described recipes are not limited to the case of newly creating them, but may be prepared by, for example, changing the existing recipes already installed in the substrate processing apparatus. In the case of changing the recipes, the changed recipes may be installed in the substrate processing apparatus via an electric communication line or a recording medium in which the recipes are recorded. In addition, by operating the input/output device 122 installed in the existing substrate processing apparatus, the existing recipes already installed in the substrate processing apparatus may be directly changed.

Figure 5A:
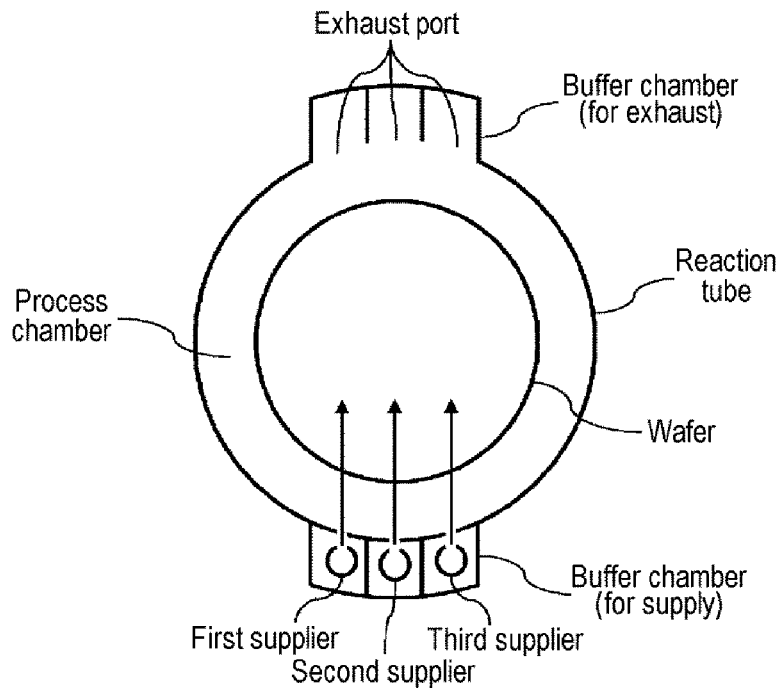
FIGS. 5A and 5B are horizontal sectional views showing modifications of a vertical process furnace, respectively, in which a reaction tube, a buffer chamber, a nozzle and the like are shown in a partially extracted state.
Figure 5B:
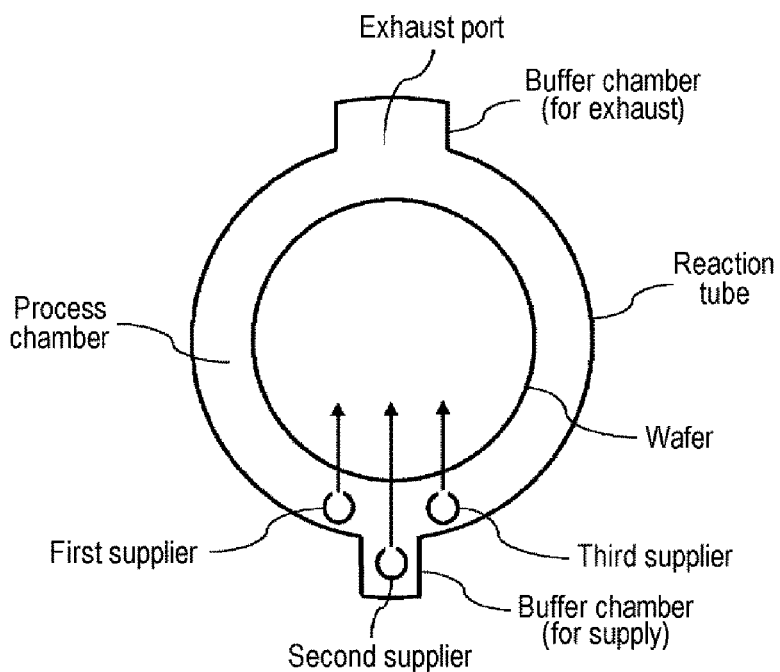

In the above-described embodiment, there has been described an example where the first to third suppliers are installed in the process chamber so as to extend along the inner wall of the reaction tube. However, the present disclosure is not limited to the embodiments described above. For example, as can be noted from the cross-sectional structure of the vertical process furnace shown in FIG. 5A, a buffer chamber may be installed in the side wall of the reaction tube, and in the buffer chamber, first to third suppliers having the same configuration as in the above-described embodiment may be installed in the same arrangement as in the above-described embodiment. In FIG. 5A, there is shown an example where a supply-purpose buffer chamber and an exhaust-purpose buffer chamber are installed in the side wall of the reaction tube and are disposed at positions facing each other across the wafers. Each of the supply-purpose buffer chamber and the exhaust-purpose buffer chamber is installed to extend from the lower portion to the upper portion of the side wall of the reaction tube, i.e., along the wafer arrangement region. In addition, FIG. 5A shows an example where the supply-purpose buffer chamber is partitioned into a plurality of (three) spaces, and individual nozzles are disposed in the respective spaces. The arrangement of the three spaces of the buffer chamber is the same as the arrangement of the first to third suppliers. Furthermore, for example, as can be noted from the cross-sectional structure of the vertical process furnace shown in FIG. 5B, a buffer chamber may be installed in the same arrangement as in FIG. 5A, a second supplier may be installed in the buffer chamber, and first and third suppliers may be installed so as to sandwich the communication portion, which communicates with the process chamber, of the buffer chamber from both sides of the communication portion and so as to extend along the inner wall of the reaction tube. The configurations other than the buffer chamber and the reaction tube described with reference to FIGS. 5A and 5B are the same as the configurations of the respective parts of the process furnace shown in FIG. 1. Even when these process furnaces are used, the same effects as those of the above-described embodiment are obtained.

In the above-described embodiment, there has been described an example where a film is formed using a batch type substrate processing apparatus that processes a plurality of substrates at a time. The present disclosure is not limited to the above-described embodiments, but may be suitably applied to, for example, a case where a film is formed using a single-wafer type substrate processing apparatus that processes one or plural substrates at a time. Furthermore, in the above-described embodiment, there has been described an example where a film is formed using a substrate processing apparatus including a hot wall type process furnace. The present disclosure is not limited to the above-described embodiments, but may be suitably applied to a case where a film is formed using a substrate processing apparatus including a cold wall type process furnace.

Even in the case of using these substrate processing apparatuses, film formation can be performed under the same sequences and processing conditions as those of the above-described embodiment and modifications, and the same effects as described above are obtained.

Further, the above-described embodiment and modifications may be used in combination as appropriate. The processing procedures and processing conditions at this time may be the same as, for example, the processing procedures and processing conditions of the above-described embodiment.

The various effects described in this specification are similarly obtained not only when the formation of a film on a substrate is performed under the conditions that the processing gas supplied to the substrate is thermally decomposed (under the conditions that a self-limit is not applied) but also when the formation of a film on a substrate is performed under the conditions that the processing gas supplied to the substrate is not thermally decomposed (under the conditions that a self-limit is applied). However, the effect relating to the adjustment of the in-plane film thickness distribution among the various effects described above is particularly effectively obtained when the formation of a film on a substrate is performed under the conditions that the processing gas supplied to the substrate is thermally decomposed and the CVD reaction occurs.

[Example]

In sample A, using the substrate processing apparatus shown in FIG. 1, a Si film was formed on the wafer according to the film formation sequence shown in FIG. 4. When performing the Si film formation step, the flow rate of the $N_2$ gas supplied from the first supplier was set to a predetermined flow rate within a range of 150 to 250 sccm and the flow rate of the $N_2$ gas supplied from the second supplier was set to a predetermined flow rate within a range of 40 to 80 sccm. Other processing conditions were set to predetermined conditions falling within the processing condition range described in the above embodiment.

In sample B, using the substrate processing apparatus shown in FIG. 1, a Si film was formed on the wafer according to the film formation sequence shown in FIG. 4. When performing the Si film formation step, the flow rate of the $N_2$ gas supplied from the first supplier was set to a predetermined flow rate within a range of 450 to 550 sccm and the flow rate of the $N_2$ gas supplied from the second supplier was set to a predetermined flow rate within a range of 40 to 80 sccm. Other processing conditions were the same as the processing conditions used when preparing sample A.

In sample C, using the substrate processing apparatus shown in FIG. 1, a Si film was formed on the wafer according to the film formation sequence shown in FIG. 4. However, when performing the Si film formation step, the balance of the flow rates of the $N_2$ gases supplied from the first and second suppliers was reversed from that at the time of preparing sample A. Specifically, when performing the Si film formation step, the flow rate of the $N_2$ gas supplied from the first supplier was set to a predetermined flow rate within a range of 250 to 350 sccm and the flow rate of the $N_2$ gas supplied from the second supplier was set to a predetermined flow rate within a range of 700 to 900 sccm. Other processing conditions were the same as the processing conditions used when preparing sample A.

Figure 6A:
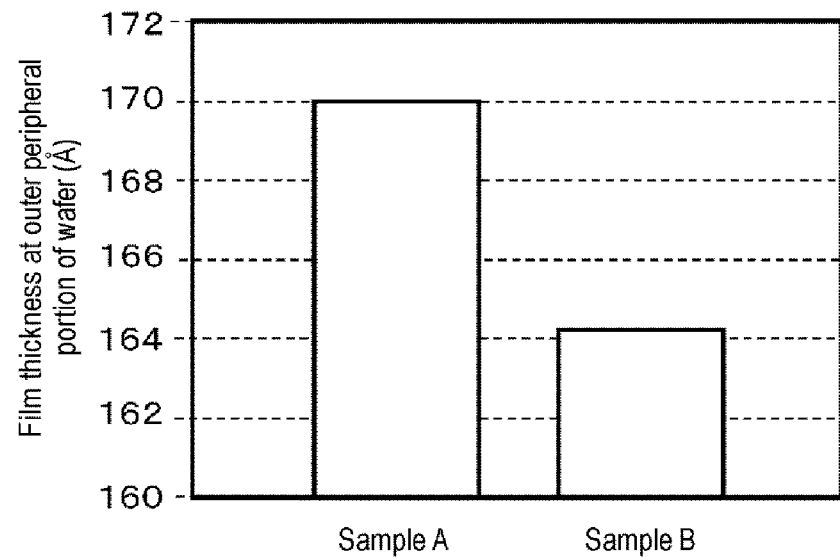
FIGS. 6A and 6B are diagrams showing film thickness measurement results at the outer peripheral portions of substrates for the films formed on the substrates.
Figure 6B:
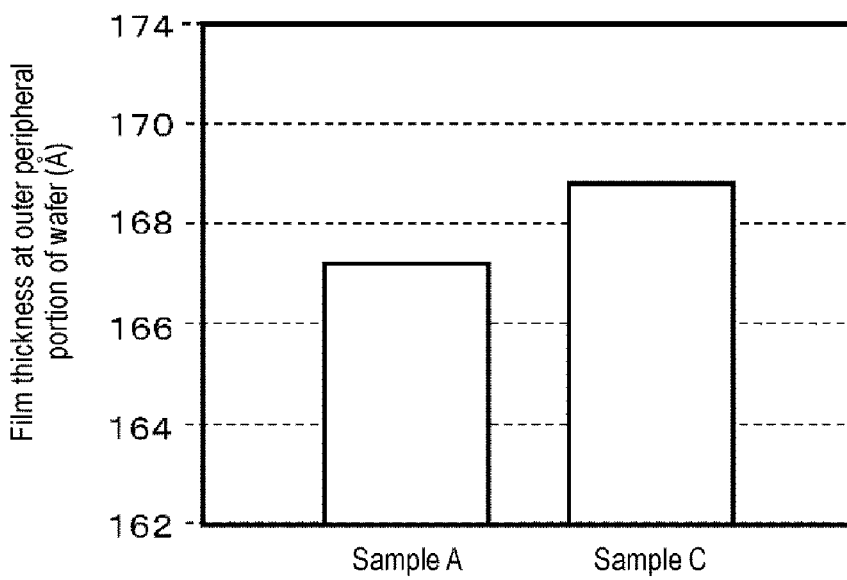

Then, the film thicknesses of the Si films of samples A to C were measured at the outer peripheral portion of the wafer and compared with each other. FIG. 6A is a diagram for comparing the measurement results of samples A and B, and FIG. 6B is a diagram for comparing the measurement results of samples A and C. The measurement positions (the distances from the center of the wafer) of samples A and B in FIG. 6A are positions corresponding to each other, and the measurement positions (the distances from the center of the wafer) of samples A and C in FIG. 6B are also positions corresponding to each other. However, the measurement positions of samples A and B in FIG. 6A and the measurement positions of samples A and C in FIG. 6B are different positions in the outer peripheral portion of the wafer. Each of the vertical axes in FIGS. 6A and 6B indicates a film thickness (A), the horizontal axis in FIG. 6A indicates samples A and B, and the horizontal axis in FIG. 6B indicates samples A and C.

According to FIG. 6A, it can be seen that the film thickness of the Si film of sample B at the outer peripheral portion of the wafer is smaller than the film thickness of the Si film of sample A at the outer peripheral portion of the wafer. That is, when performing the Si film formation step, by increasing the flow rate of the $N_2$ gas supplied from the first supplier, i.e., by increasing the ratio of the flow rate of the $N_2$ gas supplied from the first supplier to the flow rate of the $N_2$ gas supplied from the second supplier, it is possible to adjust the film thickness of the Si film formed on the outer peripheral portion of the wafer in a decreasing direction.

Further, according to FIG. 6B, it can be seen that the film thickness of the Si film of sample B at the outer peripheral portion of the wafer is larger than the film thickness of the Si film of sample A at the outer peripheral portion of the wafer. That is, when performing the Si film formation step, by reversing the flow rate balance so as to make the flow rate of the $N_2$ gas supplied from the second supplier larger than the flow rate of the $N_2$ gas supplied from the first supplier, it is possible to adjust the film thickness of the Si film formed on the outer peripheral portion of the wafer in an increasing direction.

From these results, it can be noted that, when performing the Si film formation step, by controlling the balance between the flow rate of the $N_2$ gas supplied from the first supplier and the flow rate of the $N_2$ gas supplied from the second supplier, it is possible to adjust the in-plane film thickness distribution of the Si film formed on the wafer over a wide range and in a precise manner.

According to the present disclosure in some embodiments, it is possible to control the substrate in-plane film thickness distribution of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   providing a substrate; and
   forming a film containing a main element on the substrate by performing:
      supplying a first inert gas from a first supplier to the substrate;
      supplying a second inert gas from a second supplier to the substrate; and
      supplying a first processing gas containing the main element constituting the film from a third supplier, which is installed on an opposite side of the first supplier across a straight line passing through the second supplier and a center of the substrate, to the substrate,
   wherein the act of forming the film is performed under a condition in which adsorption of the main element, which is contained in the first processing gas, on a surface of the substrate is not self-limited, and
   wherein in the act of forming the film, a substrate in-plane film thickness distribution of the film formed on the substrate is adjusted by controlling a balance between a flow rate of the first inert gas supplied from the first supplier and a flow rate of the second inert gas supplied from the second supplier.

2. The method according to claim 1, wherein the flow rate of the first inert gas supplied from the first supplier is different from the flow rate of the second inert gas supplied from the second supplier.

3. The method according to claim 1, wherein the flow rate of the first inert gas supplied from the first supplier is larger than the flow rate of the second inert gas supplied from the second supplier.

4. The method according to claim 1, wherein the flow rate of the first inert gas supplied from the first supplier is smaller than the flow rate of the second inert gas supplied from the second supplier.

5. The method according to claim 1, further comprising: after the act of providing the substrate and before the act of forming the film, forming a seed layer on the substrate by supplying a second processing gas from the first supplier to the substrate, supplying the second inert gas from the second supplier to the substrate, and supplying a third inert gas from the third supplier to the substrate,
   wherein in the act of forming the seed layer, a substrate in-plane thickness distribution of the seed layer formed on the substrate is adjusted by controlling a balance between a flow rate of the second inert gas supplied from the second supplier and a flow rate of the third inert gas supplied from the third supplier.

6. The method according to claim 1, further comprising: after the act of providing the substrate and before the act of forming the film, forming a seed layer on the substrate by supplying the first inert gas from the first supplier to the substrate, supplying the second inert gas from the second supplier to the substrate, and supplying a second processing gas from the third supplier to the substrate, wherein in the act of forming the seed layer, a substrate in-plane thickness distribution of the seed layer formed on the substrate is adjusted by controlling a balance between a flow rate of the first inert gas supplied from the first supplier and a flow rate of the second inert gas supplied from the second supplier.

7. The method according to claim 1, wherein when seen in a plan view, the second supplier is disposed to face an exhaust port configured to exhaust the respective gases across the substrate interposed between the second supplier and the exhaust port, and the first supplier and the third supplier are disposed so as to sandwich a straight line, which passes through the second supplier and the exhaust port.

8. The method according to claim 5, wherein the flow rate of the second inert gas supplied from the second supplier is different from the flow rate of the third inert gas supplied from the third supplier.

9. The method according to claim 5, wherein the flow rate of the second inert gas supplied from the second supplier is smaller than the flow rate of the third inert gas supplied from the third supplier.

10. The method according to claim 5, wherein the flow rate of the second inert gas supplied from the second supplier is larger than the flow rate of the third inert gas supplied from the third supplier.

11. The method according to claim 5, wherein in the act of forming the seed layer, a cycle is performed a predetermined number of times, the cycle including alternately performing:
supplying a third processing gas from any one of the first supplier, the second supplier and the third supplier to the substrate; and
supplying the second processing gas from the first supplier to the substrate, supplying the second inert gas from the second supplier to the substrate, and supplying the third inert gas from the third supplier to the substrate.

12. The method according to claim 11, wherein in the act of supplying the third processing gas, the first inert gas is supplied from the first supplier to the substrate, the third processing gas is supplied from the second supplier to the substrate, and the third inert gas is supplied from the third supplier to the substrate.

13. The method according to claim 6, wherein the flow rate of the first inert gas supplied from the first supplier is different from the flow rate of the second inert gas supplied from the second supplier.

14. The method according to claim 6, wherein the flow rate of the first inert gas supplied from the first supplier is larger than the flow rate of the second inert gas supplied from the second supplier.

15. The method according to claim 6, wherein the flow rate of the first inert gas supplied from the first supplier is smaller than the flow rate of the second inert gas supplied from the second supplier.

16. The method according to claim 6, wherein in the act of forming the seed layer, a cycle is performed a predetermined number of times, the cycle including alternately performing:
supplying a third processing gas from any one of the first supplier, the second supplier and the third supplier to the substrate; and
supplying the first inert gas from the first supplier to the substrate, supplying the second inert gas from the second supplier to the substrate, and supplying the second processing gas from the third supplier to the substrate.

17. The method according to claim 16, wherein in the act of supplying the third processing gas, the first inert gas is supplied from the first supplier to the substrate, the third processing gas is supplied from the second supplier to the substrate, and a third inert gas is supplied from the third supplier to the substrate.

18. The method according to claim 7, wherein the first supplier and the third supplier are line-symmetrically disposed with respect to the straight line, as a symmetry axis, passing through the second supplier and the exhaust port.

19. A substrate processing apparatus, comprising:
a process chamber in which a substrate is processed;
a first supply system configured to supply a first inert gas from a first supplier to the substrate in the process chamber;
a second supply system configured to supply a second inert gas from a second supplier to the substrate in the process chamber;
a third supply system installed on an opposite side of the first supplier across a straight line passing through the second supplier and a center of the substrate, and configured to supply a processing gas from a third supplier to the substrate in the process chamber, the processing gas containing a main element that constitutes a film to be formed; and
a controller configured to control the first supply system, the second supply system and the third supply system so as to form the film containing the main element on the substrate by performing: supplying the first inert gas from the first supplier to the substrate, supplying the second inert gas from the second supplier to the substrate, and supplying the processing gas from the third supplier to the substrate in a state in which the substrate is provided in the process chamber, wherein the act of forming the film is performed under a condition in which adsorption of the main element, which is contained in the processing gas, on a surface of the substrate is not self-limited, and wherein in the act of forming the film, a substrate in-plane film thickness distribution of the film formed on the substrate is adjusted by controlling a balance between a flow rate of the first inert gas supplied from the first supplier and a flow rate of the second inert gas supplied from the second supplier.

20. A non-transitory computer-readable recording medium storing a program that causes, by a computer, a substrate processing apparatus to perform:
providing a substrate in a process chamber of the substrate processing apparatus;
forming a film containing a main element on the substrate in the process chamber by performing:
supplying a first inert gas from a first supplier to the substrate;
supplying a second inert gas from a second supplier to the substrate; and
supplying a processing gas containing the main element constituting the film from a third supplier, that is installed on an opposite side of the first supplier across a straight line passing through the second supplier and a center of the substrate, to the substrate; and
adjusting a substrate in-plane film thickness distribution of the film formed on the substrate by controlling a balance between a flow rate of the first inert gas supplied from the first supplier and a flow rate of the second inert gas supplied from the second supplier in the act of forming the film, wherein the act of forming the film is performed under a condition in which adsorption of the main element, which is contained in the processing gas, on a surface of the substrate is not self-limited.

* * * * *